United States Patent [19]

Saldanha et al.

[11] Patent Number: 5,682,519

[45] Date of Patent: Oct. 28, 1997

[54] METHOD FOR REDUCING POWER CONSUMPTION OF SWITCHING NODES IN A CIRCUIT

[75] Inventors: Alexander Saldanha, El Cerrito; Patrick McGeer, Orinda; Luciano Lavagno, Berkeley, all of Calif.

[73] Assignee: Cadence Design Systems, Inc., San Jose, Calif.

[21] Appl. No.: 427,031

[22] Filed: Apr. 24, 1995

[51] Int. Cl.$^6$ .................................................. G06F 17/50
[52] U.S. Cl. .................... 395/500; 364/489; 364/490; 364/491; 364/488
[58] Field of Search ................................ 395/488–491; 364/578

[56] References Cited

U.S. PATENT DOCUMENTS

| | | | |
|---|---|---|---|
| 4,811,237 | 3/1989 | Putatunda et al. | 364/491 |
| 4,960,724 | 10/1990 | Watanabe et al. | 437/51 |
| 5,243,538 | 9/1993 | Okuzawa et al. | 364/489 |
| 5,392,221 | 2/1995 | Donath et al. | 364/489 |
| 5,487,017 | 1/1996 | Prasad et al. | 364/488 |

OTHER PUBLICATIONS

A. P. Chandrakasan et al., "Hyper–LP: A System For Power–Minimization Using Architectural Transformations," 1992, *Proceedings of the International Conference on Computer Design*, pp. 300–303.

A. Shen et al., "On Average Power Dissipation and Random Pattern Testability of CMOS Combinational Logic Circuits," 1992, *Proceedings of the International Conference on Computer Design*, pp. 402–407.

R. Murgai et al., "Decomposition for Minimum Transition Activity," 1994, *Proceedings of the Low–Power Workshop*, pp. 1–10.

V. Tiwari et al., "Technology Mapping for Low Power," 1993, *Proceedings of the 30th ACM/IEEE Design Automation Conference*, pp. 74–79.

C. Y. Tsui et al., "Technology Decomposition and Mapping Targeting Low Power Dissipation," 1993, *Proceedings of 30th ACM/IEEE Design Automation Conference*, pp. 68–73.

L. Benini and G. De Micheli, "State Assignment for Low Power Dissipation," 1994, *Proceedings of EDAC'94*, pp. 136–139.

M. Alidina et al., "Precomputation–Based Sequential Logic Optimization for Low Power," 1994, *Proceedings of the International Conference on Computer–Aided Design*, pp. 74–81.

R. Bryant, "Graph–Based Algorithms for Boolean Function Manipulation," 1996, *IEEE Transactions on Computers*, vol. C–35, No. 8, pp. 677–691.

D. A. Huffman, "A Method for the Construction of Minimum Redundancy Codes," 1952, *Proceedings of the IRE*, vol. 40 pp. 1098–1101.

A. V. Aho et al., "Algorithims on Graphs", 1974, *The Design and Analysis of Computer Algorithms*, Chapter 5, pp. 171–223.

G. D. Hachtel et al., "Re–Encoding Sequential Circuits to Reduce Power Dissipation," 1994, *Proceedings of the International Conference on Computer–Aided Design*, pp. 70–73.

*Primary Examiner*—Kevin J. Teska
*Assistant Examiner*—Vuthe Siek
*Attorney, Agent, or Firm*—Townsend and Townsend and Crew LLP

[57] ABSTRACT

A method for generating a low-power circuit from a Shannon graph having a plurality of primary inputs, a plurality of nodes including parent and child nodes, a first end-terminal, and a second end-terminal, each of the plurality of nodes having output edges associated therewith, includes the steps of: substituting the plurality of nodes and associated output edges with a plurality of cells, one cell for each node and output edge associated therewith, each cell including a plurality of elements; coupling a cell substituted for a parent node to cells substituted for child nodes of the parent node; and bypassing particular elements of child nodes having only one parent node.

19 Claims, 8 Drawing Sheets

METHOD FOR REDUCING POWER CONSUMPTION OF SWITCHING NODES IN A CIRCUIT

FIELD OF THE INVENTION

The present invention relates to methods of synthesizing gate level digital circuits and the circuits derived therefrom and, in particular, synthesizing low power circuits from Shannon graphs by reducing the number of transitions occurring on gates therein which do not propagate to an output.

BACKGROUND OF THE INVENTION

With the advent of battery operated computers and hand held digital electronic devices, circuit designers have become more conscious of the need to reduce power consumed by the integrated circuits (ICs) used in their designs.

Various techniques for reducing the power consumed in electronic circuits have been applied at all levels of design. For a survey of generally applicable techniques, attention is directed to "Hyper-LP: A System For Power Minimization Using Architectural Transformations", by A. P. Chandrakasan, M. Potkonjak, J. Rabaey, and R. W. Broderson, *Proceedings of the International Conference on Computer-Aided Design*, pp. 300–303, (November 1992), [IEEE 0-8186-3010-8/92].

Logic-Optimization techniques modify well known algorithms for logic optimization such as node simplification and partial collapsing, which are well known in the art. Other works of interest are "On Average Power Dissipation and Random Pattern Testability of CMOS Combinational Logic Circuits", by A. Shen, A. Ghosh, S. Devadas, and K. Keutzer, *Proceedings of the International Conference on Computer-Aided Design*, pp. 402–407, (November 1992), [IEEE 0-8186-3010-8/92], discussing the logic-optimization technique of disjoint cover realization; "Decomposition for Minimum Transition Activity", by R. Murgai, R. K. Brayton, and A. Sangiovanni-Vincentelli, *Proceedings of the Low-Power Workshop*, pp. 1–10, Napa, Calif., (April 1994) [Dept. EECS, Univ. of Cal. Berkeley], discussing the technique of node decomposition; and "Technology Mapping for Low Power", by V. Tiwari, P. Ashar, and S. Malik, *Proceedings of the 30th ACM/IEEE Design Automation Conference*, pp. 74–79, (June 1993), [ACM 0-89791-577-1/93/0006-0074], and in "Technology Decomposition and Mapping Targeting Low Power Dissipation", by C. Y. Tsui, M. Pedram, and A. M. Despain, *Proceedings of the 30th ACM/IEEE Design Automation Conference*, pp. 68–73, (June 1993), [ACM 0-89791-577-1/93/0006/0068], both discussing technology mapping to obtain circuits with reduced switching activity.

A problem with logic-optimization techniques is that circuit switching time and propagation delays are often not accounted for in these standard logic optimization algorithms. All of the above techniques are based on a zero-delay model, where only the final stable value on each gate is considered. It remains unclear whether results obtained using the above techniques are related to the actual power consumed in the circuit. As a result, none of these techniques have reported results with an actual significant power reduction.

The State-Encoding approach is based on the observation that a sizable fraction of logic in most circuits is devoted to computing the next state function, as discussed in "State Assignment for Low Power Dissipation", by L. Benini, G. DeMicheli, *Proceedings of EDAC'94*, (1994). As a result, it is reasoned that if neighboring states in the state transition graph differ in very few bits, few transitions will be required on most input-vector changes. Re-encoding of sequential logic circuits to minimize transition activity is described in the paper, "Re-encoding Sequential Circuits to Reduce Power Dissipation", by G. D. Hachtel, M. Hermida, A. Pardo, M. Poncino, and F. Somenzi, *Proceedings of the International Conference on Computer-Aided Design*, pp. 70–73, (November 1994), [ACM 0-89791-690-5/94/0011/0070]. A basic problem with state-encoding approaches is that it is often difficult to make strong statements about the transition activity in a circuit when the input-output function and the state code is known but the actual implementation of the Combinational logic circuit is not yet known. This is not to say that this technique cannot be usefully applied in conjunction with the techniques disclosed and claimed herein.

The Pre-Computation technique attempts to reduce power consumption by selectively pre-computing some of the output logic values one clock cycle in advance. The pre-computed values are then used to reduce the transition activity in the next clock cycle. While a few pre-computation architectures have been explored, for instance, "Precomputation-Based Sequential Logic Optimization for Low Power", by M. Alidina, J. Monteiro, S. Devadas, A. Ghosh, and M. Papaefthymiou, *Proceedings of the International Conference on Computer-Aided Design*, pp. 74–81, (November 1994), [ACM0-89791-690-5/94/0011/0074], it appears that for effective power reduction a specific pre-computation architecture must be designed for each circuit class. The technique appears to be more effective on data path circuits with a regular logic structure, e.g., arithmetic. However, the technique is not as effective on control circuits that do not have regular logic structures, also called random logic.

A general objection to these approaches is that it is often difficult to estimate either a peak or an average power consumption of a circuit, which are complex functions of both the logical and timing properties of the circuit. Given a delay model based upon timing properties, efficiently determining the logical behavior of circuits over time, under all possible input vectors is a very difficult problem. Thus, one is often forced to rely on timing simulation. However, there is neither a guarantee that the set of input test vectors chosen for simulation is representative of the whole input space nor that the set of input test vectors contains the worst-case vector.

FIG. 1 illustrates a simple Shannon graph. The Shannon graph in FIG. 1 includes a set of nodes, also called switching nodes, each having one or more input edges and two output edges. In the example, the Shannon graph labeled f, 20, has a root node 10 labeled $X_1$ and output edges 30 and 40, labeled $x_1$ and $x_{,1}$, respectively. Note: x' as used herein is equivalent to $\bar{x}$, the logical complement to x.

A drawback with current circuits is that certain nodes in a circuit may not affect the eventual output state of the circuit. This drawback is illustrated below in the following example. In this example, three nodes are labeled A, B and C, having input states denoted X, Y and Z:

A=X AND Y
B=Z AND Y
C=A OR B

In the case where X=0, Y=1 and Z=1, the output state of A, B and C are as follows: A=0, B=1 and C=1. Now if the input states changes from X=4, Y=1 and Z=1 to X=1, Y=1 and Z=1, assuming a unit delay, node A changes from 0 to 1, node B remains at 1, and node C remains at 1. Since the output for B did not change, the output state of C was independent of the value of A. The final state of A was not needed to determine the correct output of the circuit with respect to node C, because the result of the transition of A from 0 to 1 did not propagate to the node C. Because node A switched without having an impact on node C, the power consumed by the switching of A could have been saved. In larger circuits containing even greater number of nodes in multiple pathways, many transitions do not eventually propagate to the output. Thus, eliminating those components whose transitions do not propagate to the output in a circuit is important.

What is needed in this art is a method for deriving a low power circuit from a Shannon graph. Since transitions depend not only upon logical properties, but also upon timing properties of circuit components, it is desirable in this art to reduce the number of transitions on switching nodes and to reduce the number of gates which do not propagate to the output, so as to reduce total power consumption of the circuit.

SUMMARY OF INVENTION

The present invention provides a method for generating a low-power circuit from a Shannon graph a circuit derived therefrom and an apparatus for generating a low-power circuit from a Shannon graph.

According to one embodiment of the invention, a method for generating a low-power circuit from a Shannon graph having a plurality of primary inputs, a plurality of nodes including parent and child nodes, a first end-terminal, and a second end-terminal, each of the plurality of nodes having output edges associated therewith, includes the steps of: substituting the plurality of nodes and associated output edges with a plurality of cells, one cell for each node and output edge associated therewith, each cell including a plurality of elements; coupling a cell substituted for a parent node to cells substituted for child nodes of the parent node; and bypassing particular elements of child nodes having only one parent node.

According to another embodiment of the invention a method of forming a low-power circuit from a Shannon graph having a plurality of nodes and end-terminals, the plurality of nodes including parent nodes and child nodes, each parent node having a plurality of output edges and a plurality of primary input leads, each of the plurality of output edges for each parent node coupled to a child node, includes the steps of: substituting the plurality of nodes with a plurality of OR gates, one OR gate for each node; substituting the end terminals with OR gates, one OR gate for each terminal; and substituting the plurality of output edges for a particular parent node with a plurality of AND gates, one AND gate for each output edge; and coupling an output of an OR gate substituted for the particular parent node to first inputs of the plurality of AND gates for the particular parent node; and coupling the plurality of primary input leads for the particular parent node to second inputs of the plurality of AND gates for the particular parent node; coupling outputs of the plurality of AND gates for the parent node to inputs of OR gates for each child node of the particular parent node; and coupling outputs the plurality of AND gates for the parent node to inputs of OR gates for each end terminal of the particular parent node; and bypassing OR gates having inputs coupled to less than two of the plurality of AND gates.

According to another embodiment of the invention a system for generating a low-power circuit from a Shannon graph having a plurality of primary inputs, a plurality of nodes including parent and child nodes, a first end-terminal, and a second end-terminal, each of the plurality of nodes having output edges associated therewith, the system including a processor and a memory, includes: an input device, coupled to the memory for inputting the Shannon graph into the memory; means, coupled to the memory for substituting the plurality of nodes and associated output edges with a plurality of cells, one cell for each node and output edge associated therewith, each cell including a plurality of elements; means, coupled to the memory for coupling a cell substituted for a parent node to cells substituted for child nodes of the parent node; means, coupled to the memory for bypassing particular elements of child nodes having only one parent node; and an output device, coupled to the processor and to the memory for outputting the low-power circuit.

BRIEF DESCRIPTION OF THE DRAWINGS

In order to more fully understand the present invention, reference is made to the accompanying drawings. Understanding that these drawings are not to be considered limitations in the scope of the invention, the presently preferred embodiments and the presently understood best mode of the invention are described with additional detail through use of the accompanying drawings in which.

DETAILED DESCRIPTION OF THE PREFERRED EMBODIMENT

The present invention is directed to generation of low power circuits from a Shannon graph which reduces the number of transitions on switching nodes. It should be understood that one considered skilled in this art would readily understand digital logic and digital circuit components and their functionality, concepts underlying a Shannon graph, and concepts underlying a binary decision diagram (BDD), a reduced Shannon graph having no path containing two distinct edges labeled with the same variable. See, "Graph-Based Algorithms for Boolean Functions Manipulation", by Randal Bryant, *IEEE Transactions On Computers*, Vol. C-35, No. 8, pp. 677–91, (August 1986), [IEEE 0018-9340/864/0800-0677], incorporated herein by reference.

SHANNON GRAPHS

A Shannon graph is a graphical representation of a function and can be defined more formally by the recursive expansion of the following formula:

$$f = x \wedge f(x=1) \vee \bar{x} \wedge f(x=0) \qquad (1)$$

Figure 1:
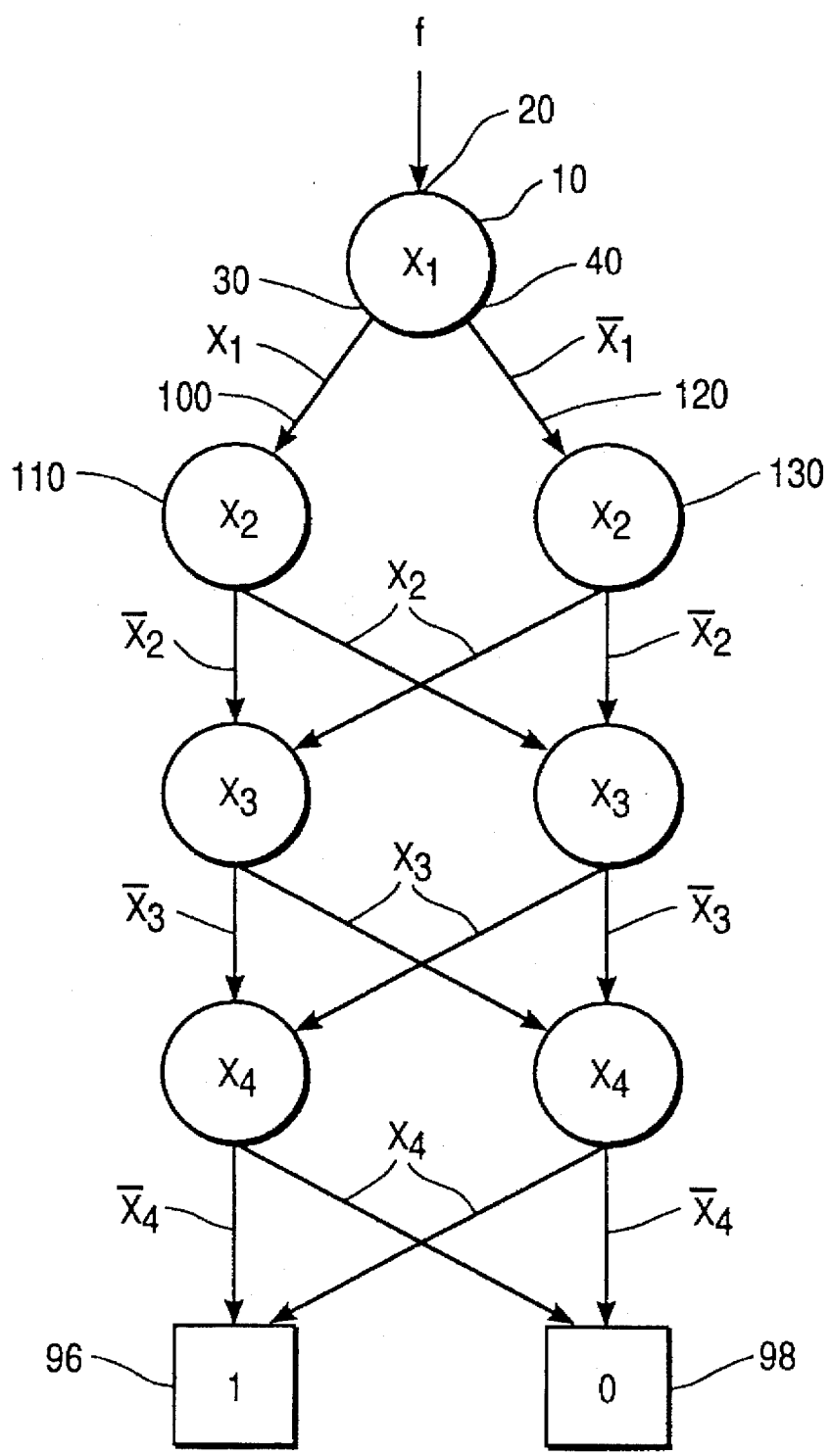
FIG. 1 illustrates a simple Shannon graph.

The present invention takes as its starting point a Shannon graph defined recursively by the following properties, with illustrative reference to FIG. 1:

1. Nodes labeled 1 and 0 are end-terminals, labeled 96 and 98. Either the one end-terminal 96 or the zero end-terminal 98 will be reached, depending on path traversed in the Shannon graph; and 2. A graph of a non-constant function f is a rooted, labeled, binary, directed, acyclic graph with a root node having the following sub-properties:

i. The out degree of a root node of the Shannon graph is two, labeled output edges 30 and 40;

ii. One of the output edges of the root node is labeled x, and the other output edge is labeled x', where x is any variable such that f(x) is not equal to f(x'). This is illustrated by output edges 30 and 40, respectively;

iii. The output edge x is attached to the input edge of a root node of a Shannon graph for f(x), 100 and node 110; and iv. The output edge x' is attached to the input edge of a root node of a Shannon graph for f(x'), 120 and node 130.

If no two nodes in a Shannon graph of f are roots of Shannon graphs of identical functions, a Shannon graph of f is said to be "reduced". A special case of the reduced Shannon graph is that of a binary decision diagram (BDD) which has the property that no path through the reduced Shannon graph contains two distinct edges with the same label. The Shannon graph in FIG. 1 illustrates a BDD.

By convention, the output edge labeled $x_i$ from the node $X_i$ corresponds to the edge traversed if $x_i$ evaluates to 1, and the output edge $x'_i$ corresponds to the edge traversed if $x_i$ evaluates to 0. The same convention and representation is used herein to label a node's output edges and represent the states of the respective output edges.

The user who designs the Shannon graph pre-defines the functions such that the graph produces the desired output states, depending on the values for primary input leads (also known as input vectors). From such a starting graph, the present invention derives low power circuits.

SYSTEM CONFIGURATION

Figure 2:
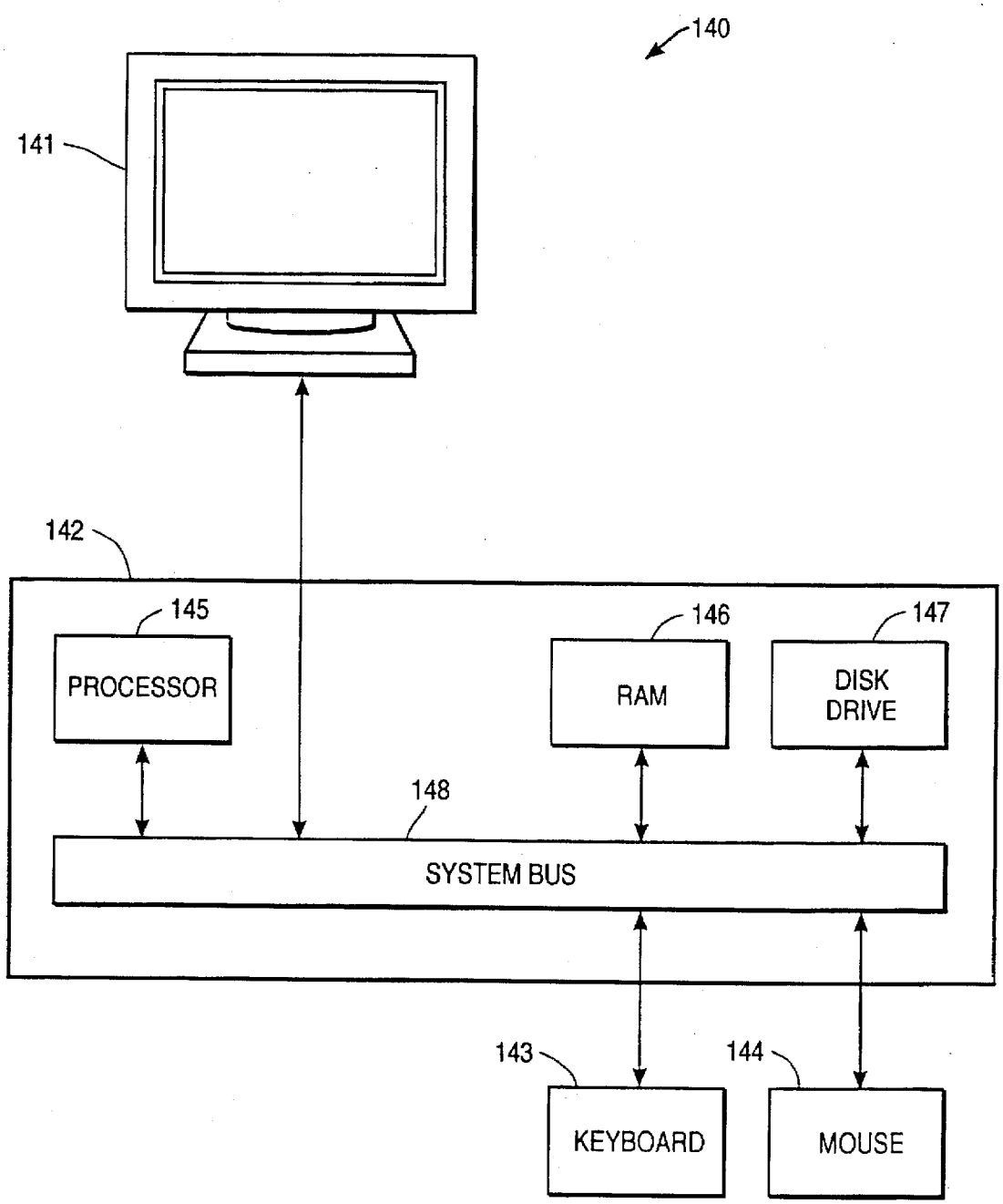
FIG. 2 is a block diagram of a system according to a preferred embodiment of the present invention.

FIG. 2 is a block diagram of a system 140 according to a preferred embodiment of the present invention. System 140 includes a display monitor 141, a computer 142, a keyboard 143, and a mouse 144. Computer 142 includes familiar computer components such as a processor 145, and memory storage devices such as a random access memory (RAM) 146, a disk drive 147, and a system bus 148 interconnecting the above components. In a preferred embodiment, System 140 includes a SPARC-10, 40 MegaHertz based computer, running the UNIX operating system, both from Sun Microsystems, and a low power synthesis module which is part of the Sequential Interactive System (SIS) software available from University of California, Berkeley.

FIG. 2 is representative of but one type of computer system for embodying the present invention. It will be readily apparent to one of ordinary skill in the art that many computer system types and configurations are suitable for use in conjunction with the present invention.

DESCRIPTION OF THE PREFERRED EMBODIMENT

Figure 3A:
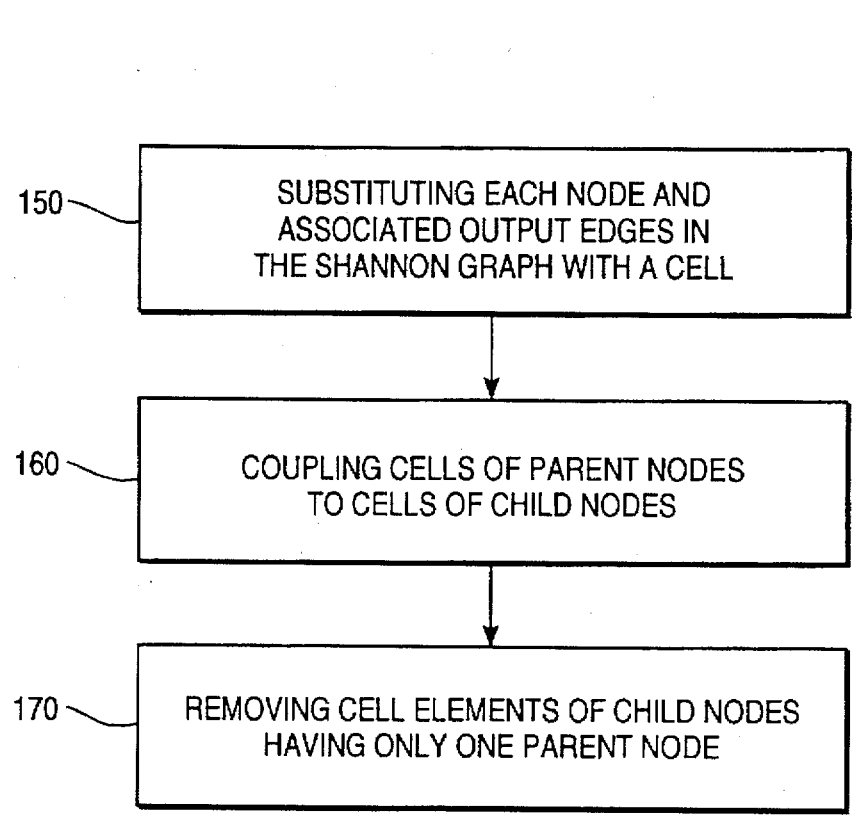
FIGS. 3a and 3b are flow diagrams of embodiments of the process of generating a low power circuit from a Shannon graph.
Figure 3B:
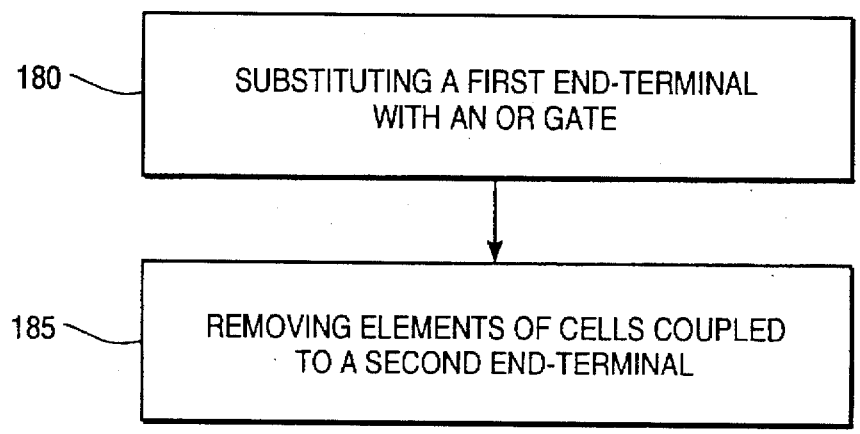

FIGS. 3a and 3b are flow diagrams of embodiments of the process of generating a low power circuit from a Shannon graph.

Figure 4:
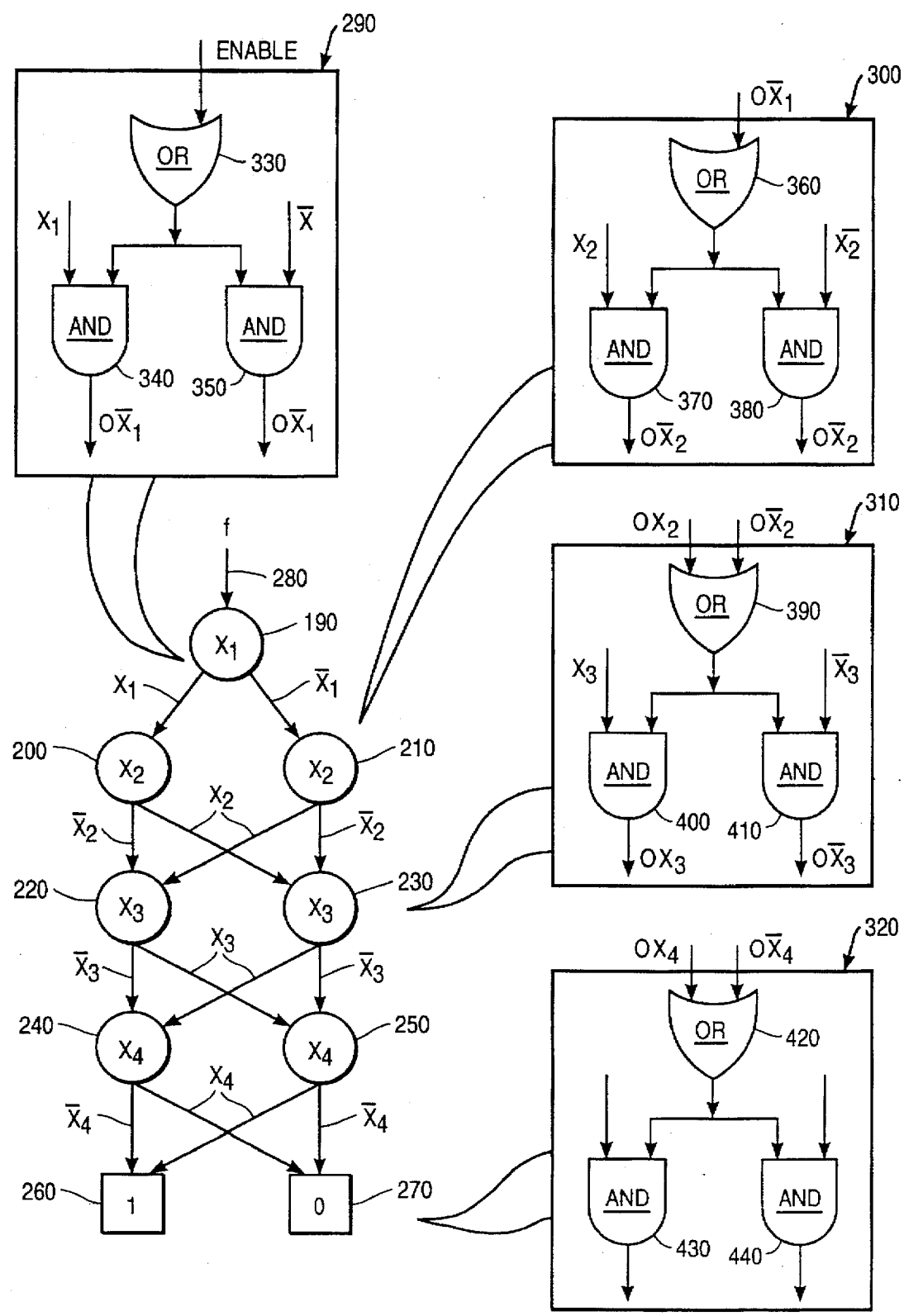
FIG. 4 illustrates substituting nodes in the Shannon graph of FIG. 1 with a cell.

In FIG. 3a, each node and associated output edges of each node are initially substituted with a standard circuit, or cell (step 150). In the preferred embodiment, the cell includes logic elements including an OR gate and two AND gates. Specifically, the nodes and end-terminal are replaced with an OR gate, and the output edges of the node are replaced with AND gates. A typical cell and elements within the cell are illustrated in FIG. 4 and will be further described in conjunction with FIG. 4 below.

Figure 5:
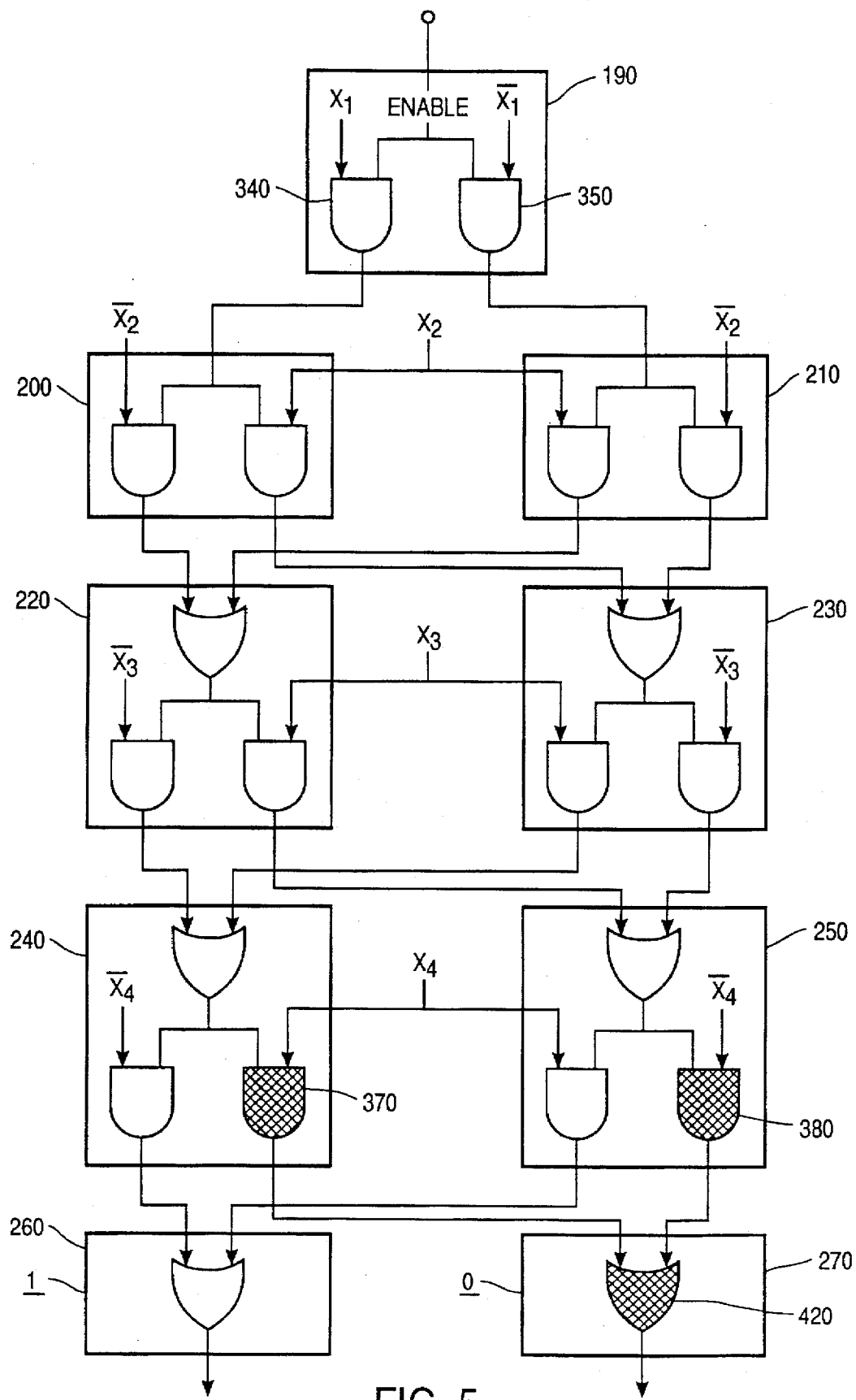
FIG. 5 illustrates the result of the step of bypassing elements, AND gates and OR gates, of the circuit which only have single inputs.

In the next step of the flow diagram in FIG. 3a, cells of parent nodes and child nodes are coupled (step 160). In the next step of the flow diagram, certain elements in child nodes that only have one parent node are removed. (step 170). For example, if an AND or an OR gate only have one logic signal input, that gate is removed from the circuit and replaced with a short circuit. This is illustrated in FIGS. 4 and 5 with regard to node 190 and node 210 and will be described below.

Figure 6:
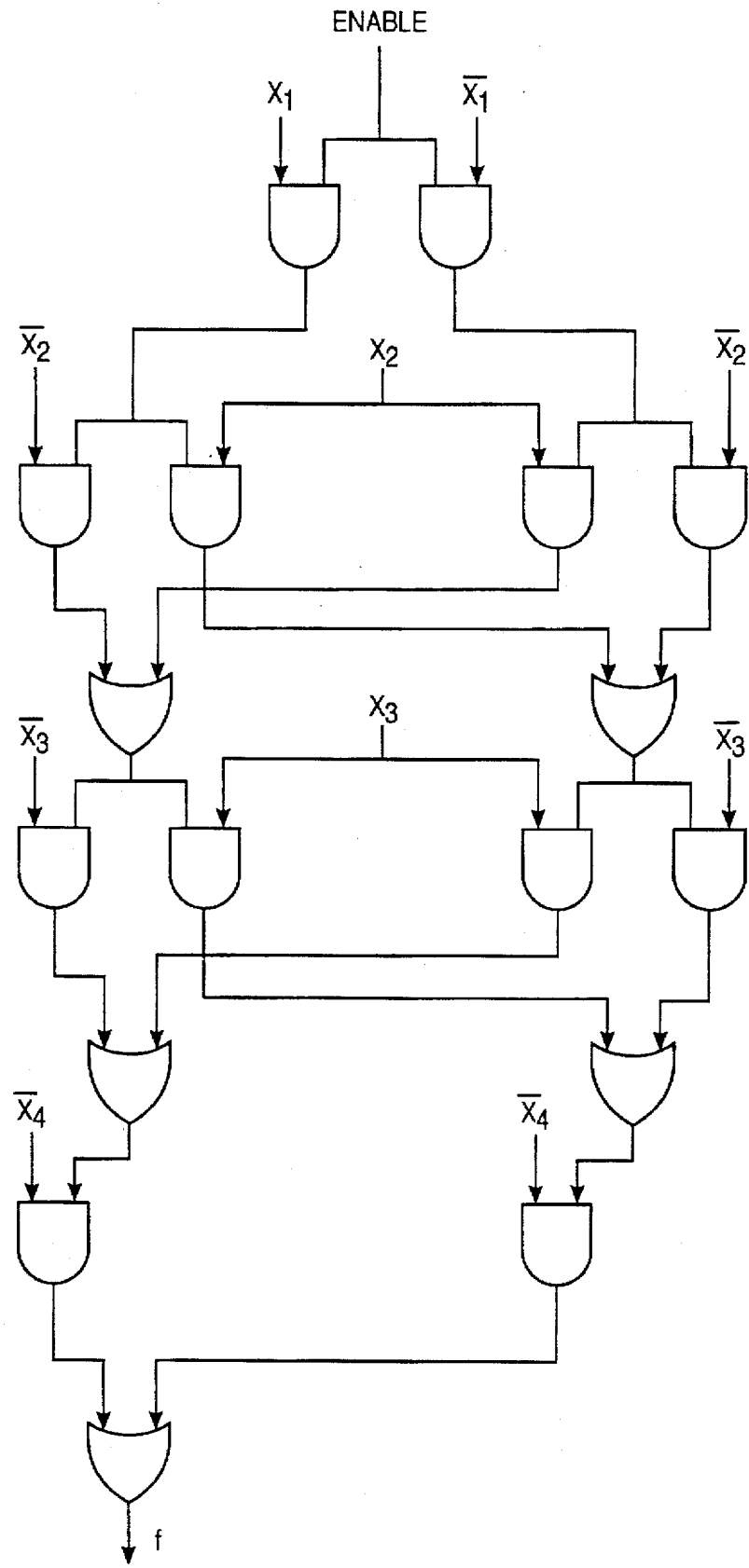
FIG. 6 illustrates the derived circuit from the Shannon graph in FIG. 4.

In another embodiment of the present invention, the steps 150–170, above are performed, in conjunction with the following steps. In FIG. 3b, the next step includes substituting a first end-terminal with an OR gate (step 180). This is illustrated in FIG. 5 as element 420, for example. The next step is to remove elements of cells coupled to a second end-terminal (step 185). Since both end-terminals are not needed to determine the output of the circuit, e.g. the one end-terminal is the logical complement of the zero end-terminal, removing a second end-terminal and the elements that are coupled to that second end-terminal, reduces more power. This is illustrated in FIGS. 5 and 6 with regard to removing zero end-terminal 270 and AND gates 370 and 380. In an alternative embodiment, the one end-terminal 260 and associated AND gates are removed.

In yet another embodiment, step 185 above is omitted. Often it is desirable to know when a circuit output has reached a stable value for a given set of primary input lead states on the input vector. In other words, it is important to be able to know when the circuit has stabilized so that a circuit ENABLE can be performed at the proper time. An example of this is an asynchronous circuit where, in order to reduce spurious transitions on gates, a gate should only be evaluated after all of the input gates connected to it have settled to their final value. By logically OR'ing the signal from the one end-terminal and the zero end-terminal of the Shannon graph, a completion signal indicating when a final value is reached is obtained.

EXAMPLE

FIG. 4 illustrates substituting nodes in the Shannon graph of FIG. 1 with a cell. The Shannon graph for function f 280 includes root node 190, nodes 200, 210, 220, 230, 240, and 250, first end node 260, second end node 270. In FIG. 4, cell 290 is substituted for node 190, cell 300 is substituted for node 210, cell 310 is substituted for node 230, and cell 320 is substituted for node 270. In the preferred embodiment of the present invention, cells 290, 300, 310, and 320 each comprise an OR gate and two AND gates. The output of the OR gate is coupled to one of the inputs of the two AND gates as shown.

To derive the low power circuit of the present invention from the starting Shannon graph, iterations preferably transpire from the root node in the direction of the end-terminals recursively. However, it should be understood that although the preferred embodiment herein described starts the substitutions at the root node in the direction of the end-terminals, it is envisioned that one could implement the present method starting in other directions (or from the middle outwards) to derive the low-power circuit according to the present method. The alternative directional embodiments are therefore to be considered within the scope of the present invention.

The preferred embodiment involves first substituting one OR gate 330 for root node 190 and an AND gate for each output edge of root node 190 in the starting graph, AND gates 340 and 350. Edge input signals $x_1$ and $x_{,1}$ are coupled to the inputs of AND gates. In particular, $x_1$ is coupled to one input of AND gate 340 and $x'_1$ is coupled to one input of AND gate 350. The other input of the AND gates are coupled to the output of OR gate 330 as shoe. The output of AND gate 340 is $Ox_1$ and the output of AND gate 350 is $Ox'_1$.

In a preferred embodiment, the OR gate input is coupled to an ENABLE signal, as shown. The purpose of this ENABLE signal will be described below.

The above step is next repeated for each child node remaining in the starting graph encountered therethrough. For example, in FIG. 4, the child nodes with regard to node 190 are nodes 200 and 210. As described in relation to node 190, nodes 200 and 210 are substituted with a single OR gate (and connecting leads) and two AND gates. FIG. 4 illustrates node 210 being substituted with OR gate 360 and AND gates 370 and 380. The input to OR gate 360 is coupled to the output from the parent nodes, in this case only node 190. In particular, OR gate 360 is coupled to $Ox'_1$ of node 190, which is the output of AND gate 350. The input edges of each substituted AND gate 370 and 380 are, coupled to the output of OR gate 360 and receive edge input signals $x_2$ and $x'_2$, respectively.

This iterative process of substituting a cell for a node continues until the end-terminals are reached. For example continuing to the $X_2$ level, there are two child nodes associated with node 200, nodes 220 and 230. Node 220 has input edge $x'_2$ and node 230 has input edge $x_2$. Node 210, also on the $X_2$ level, also has child nodes 220 and 230. Node 220 has input edge $x_2$ and node 230 has input edge $x'_2$. In accordance with the preferred embodiment herein, the nodes are substituted with an OR gate and two AND gates. In FIG. 4, node 230 is substituted with OR gate 390 and AND gates 400 and 410. The input signals to OR gate 390 are $Ox_2$ from node 200 and $Ox'_2$ from node 210. The other input signals to AND gates 400 and 410 are edge input signals $x_3$ and $x'_3$, respectively.

FIG. 5 illustrates the result of the step of bypassing elements, AND gates and OR gates, of the circuit which only have single inputs. In FIG. 4, the input into OR gate 330 is simply the ENABLE signal, thus replacing OR gate 330 with a short circuit does not affect the logical properties of node 190. Similarly, in node 210, the input into OR gate 360 is simply $x'_1$, thus replacing OR gate 360 with a short circuit does not affect the logical properties of node 210. In the present example, the OR gate in node 200 is also similarly short circuited. FIG. 5 illustrates nodes 190, 200 and 210 after the respective OR gates have been short circuited.

The output terminals 260 and 270, substituted with OR gates and AND gates in the previous step, are also simplified in the bypassing step. In FIG. 4, node 270 for example is substituted with OR gate 420 and AND gates 430 and 440. The input to OR gate 420 is coupled to nodes 240 and 250 by $Ox_4$ and $Ox'_4$, respectively, and the output of OR gate 420 is coupled to one input of AND gates 430 and 440. Since there are no edge input signals, the other input of AND gates 430 and 440 remain unconnected. Thus because the output of the AND gates only depend on the output of OR gate 420, AND gates 430 and 440 can be removed. FIG. 5 illustrates nodes 260 and 270 after the respective AND gates have been short circuited.

The iteration step of the preferred embodiment continues for all successive child nodes in the starting graph. As shown in FIG. 4, the replacement steps of the preferred embodiment have been repeated for all of the nodes in the Shannon graph.

In the next step in the present invention, one of the end-terminals is removed and AND gates which correspond to the edges which are incident upon that end-terminal are deleted. In FIG. 5, zero end-terminal 270 is marked and the gates effected by this deletion step are shown as crosshatched gates. As illustrated, two AND gates 370 and 380, associated with $Ox_4$ and $Ox'_4$, respectively, are connected directly to the OR gate 420 in the zero end-terminal 270 (also crosshatched). Deleting those gates directly associated with the zero end-terminal 270 results in the derived circuit illustrated in FIG. 6.

FIG. 6 illustrates the derived circuit from the Shannon graph in FIG. 4. By comparing the derived circuit of FIG. 5 and that of FIG. 6, the additional step of deleting those gates which do not propagate to the one end-terminal 260 helps reduce total power consumption within the circuit by eliminating extra nodes. It should be pointed out that an application of this embodiment of the present invention may not be applicable to all designs.

In an alternative embodiment of the present invention, instead of using a standard cell containing one OR gate and two AND gates, as described above for each node and end terminal, the user can directly replace the root node, and the first two children nodes, with a cell containing only two AND gates, as shown in nodes 190, 200, and 210 in FIG. 5. Further the user can directly replace the output terminals with a cell containing an OR gate, as shown in output terminals 260 and 270 in FIG. 5. For the remaining nodes, the user can then directly replace the node with a cell containing an OR gate and two AND gates, as shown in nodes 220, 230, 240, and 250 in FIG. 5.

At this point, a circuit is derived from a Shannon graph in accordance with the preferred embodiment without incorporating multiplexers and more importantly, a circuit is configured starting at the root node in a direction towards the end-terminals of the starting graph. As a result of this implementation, the signal flows in the direction from the root node to the end-terminals.

The ENABLE signal at the root node 190 is used to reset the derived circuit to a zero state. When ENABLE is set to a low input, AND gates 340 and 350 both output a low signal, and it can be seen that the remaining elements in the derived circuit are effectively reset. As a result, there are no power consuming transitions (charging or discharging) occurring within the derived circuit.

After all the elements in the derived circuit are reset, the user typically sets one or more of the input edges to a desired state, i.e., generates an input vector. An input vector might be defined as $\{x_1, x_2, x'_4\}$, for example. As soon as the states of those gates associated with the defined input vector have stabilized, the ENABLE is then set to a high state. Due to the configuration of the circuit of the present invention, the step of setting the ENABLE to a high state causes only those gates along a selected path from the root node to the end-terminal output to be at a high state. The remaining gates within the circuit remain at a low state. Thus, with each input test vector following a reset, a reduced number of activated gates along a pathway from the inputs to the outputs are active Thus, the presently derived circuit in conjunction with the ENABLE toggle allows only those gates along a pathway from input to output to switch, thus reducing power consumption.

EXAMPLE

Figure 7:
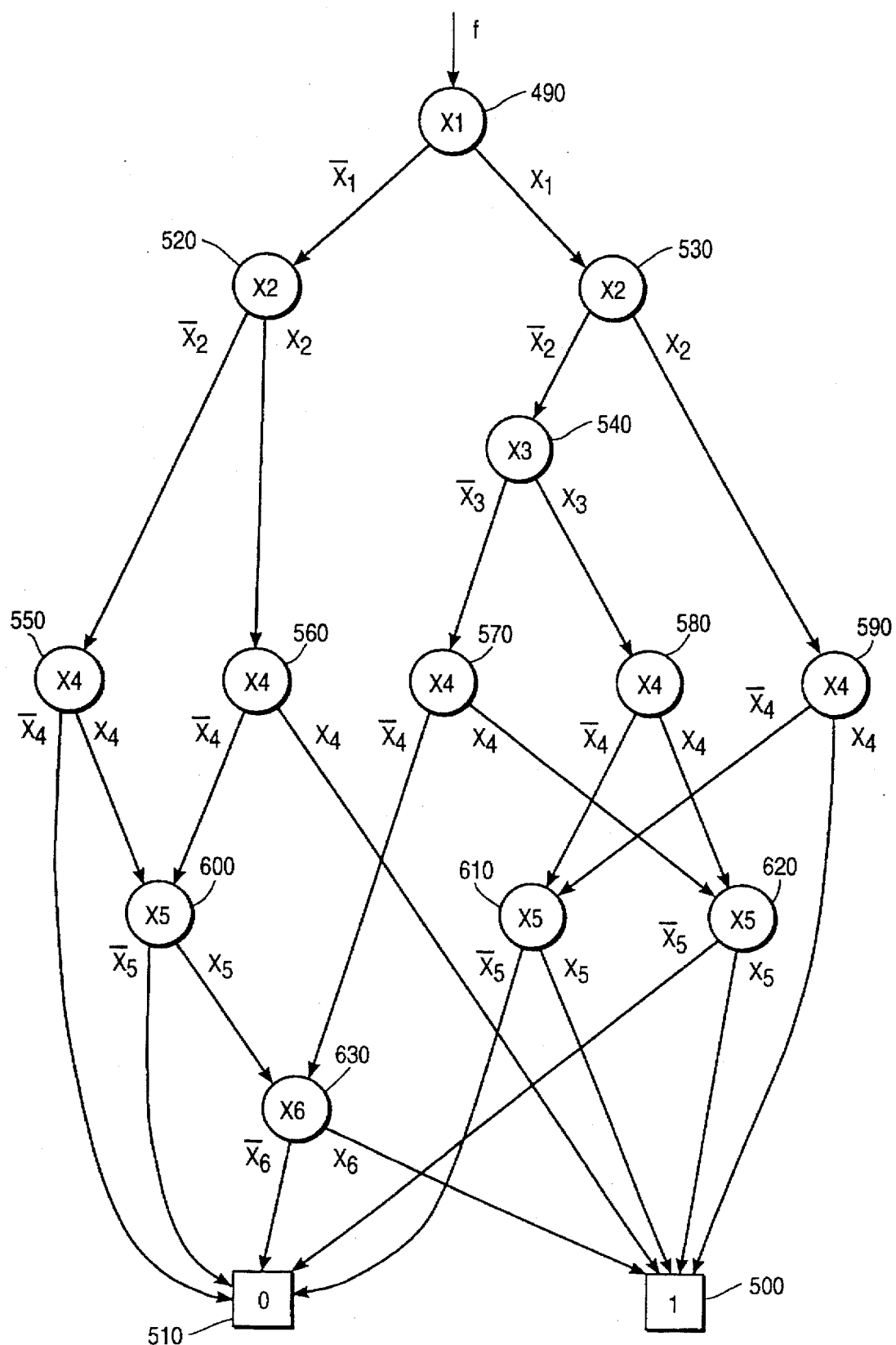
FIGS. 7 and 8 illustrate an example of using the preferred embodiment of the present invention with a Binary Decision Diagram.
Figure 8:
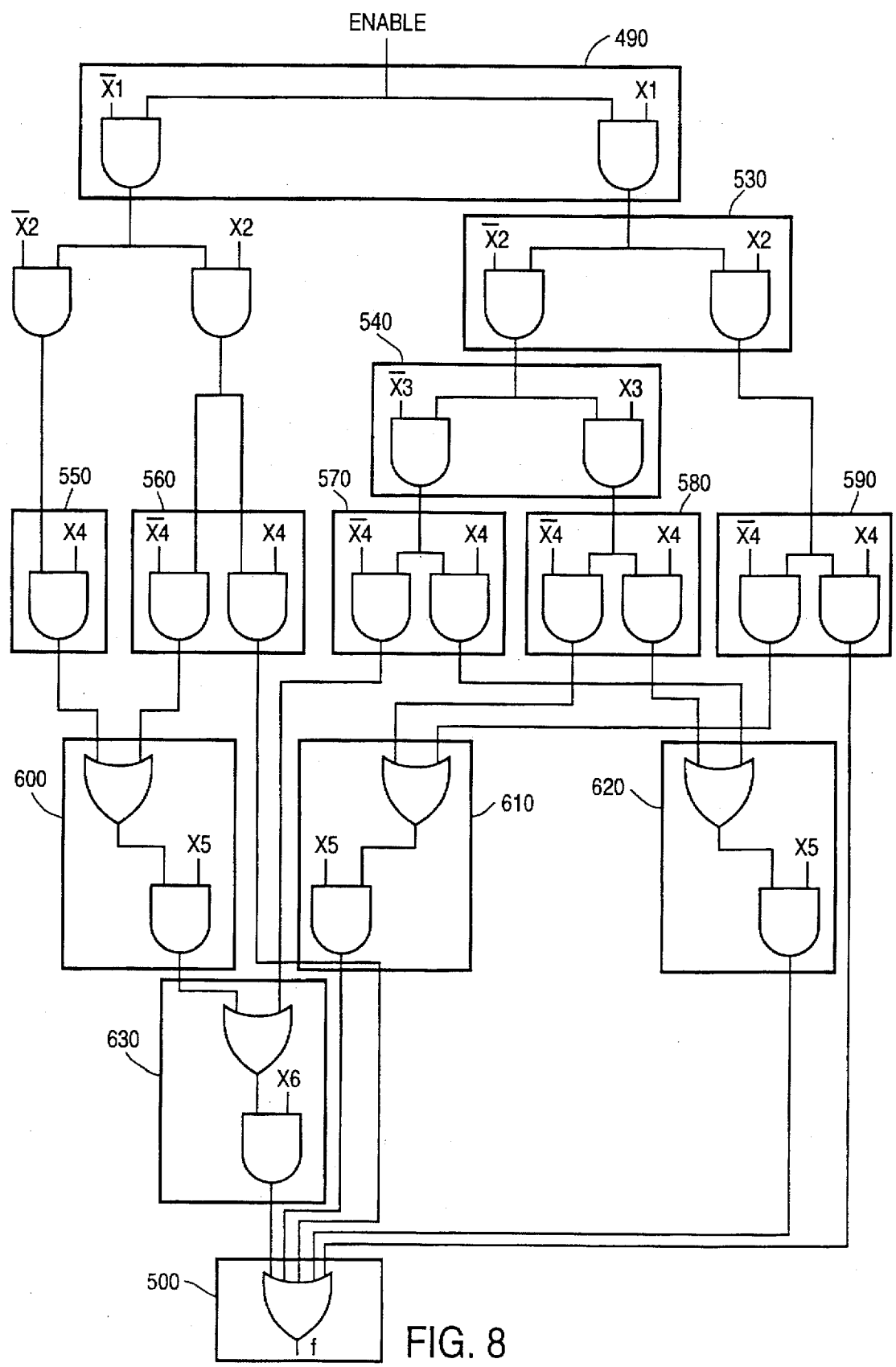

FIGS. 7 and 8 illustrate an example of using the preferred embodiment of the present invention with a Binary Decision Diagram. FIG. 7 is a diagram of a Shannon graph with the levels of the nodes already labeled starting at the root node 490 in the direction of the one and zero end-terminals, 500 and 510, respectively. Attention is also directed to FIG. 8 which is a schematic of the circuit of the present invention derived in accordance with the preferred embodiment herein from the labeled graph of FIG. 7. The output edges of each node and the one and zero end-terminals in the graph of FIG. 7 are labeled accordingly. In FIG. 8, all elements with single input signals and all elements with edges associated with the zero end-terminal have been deleted in a manner as previously discussed. Thus, only those gates with edges associated with the one end-terminal are illustrated in the derived circuit of FIG. 8.

As previously described, each node and end-terminal in the Shannon graph are first substituted with a cell including an OR gate and two AND gates. In FIG. 7, it is noted that nodes 490, 520–590 each have a single input edge, respectively $x'_1$, $x_1$, $x'_2$, $x_2$, $x'_3$, $x_3$, and $x_2$. Thus because the OR gates used in the respective nodes only receive a single input, these OR gates can be short circuited. As illustrated in FIG. 8, there are no corresponding OR gates for nodes 490, 520–590. Further, it is noted that nodes 550, 600–630 are coupled to the zero output terminal 510. Thus when the zero output terminal 510 is removed, the AND gates which output signals to zero output terminal 510 are no longer needed. As illustrated in FIG. 8, there is only one AND gate for nodes 550, 600–630.

In further detail, with reference being made alternatively to FIGS. 7 and 8, the first level (or root level) in the starting graph has a single node labeled with two output edges, $x'_1$ and $x_1$. In accordance with the present method, starting at the root node, one AND gate is substituted for each output edge therefrom. As shown in FIG. 8, two substituted AND gates are at the top of the circuit having inputs labeled $x'_1$ and $x_1$, respectively. The other input edge to each of these two AND gates is connected to an ENABLE to be used in a manner as previously disclosed.

The preferred embodiment of the present method further involves for each child node thereafter in the graph repeating the steps of substituting each node encountered therethrough with an OR gate and substituting each edge encountered therefrom with an AND gate. The second level in the graph has two $x_2$ nodes. The next step involves substituting an OR gate for each of the $x_2$ nodes and connecting their inputs accordingly. The OR gates associated with the output edges of the $x_1$ node have single input edges. Again and for reasons as previously discussed, although an OR gate was indeed substituted for each of these two nodes in accordance with the preferred embodiment herein, single input edged OR gates are not shown in the derived circuit of FIG. 8 because the single-input OR gate acts as a direct connection therethrough. Each single input node encountered in the starting graph will have a single input OR gate in the derived circuit as a result of the substitution step which can be effectively removed from the final circuit configuration.

At the $X_2$ node level in the starting graph, the preferred embodiment involves the substitution of each output edge at this node level with an AND gate. This generates the four AND gates in the derived circuit of FIG. 7 having $x'_2$ and $x_2$ input edges associated with the $X_2$ output of the previous levels AND gates.

The next level in the graph of FIG. 6 has a single node at $X_3$. Note that this $X_3$ is a single input node, namely $x'_2$ input edge. As a result, the substituted OR gate becomes a single-input OR gate which can be effectively deleted. At the $X_3$ node, there are two output edges labeled $x'_3$ and $x_3$, respectively. In accordance with the present method, these two output edges from the $X_3$ node each get substituted with an AND gate and the associated edges connected thereto. The result of this particular substitution iteration is illustrated in FIG. 8.

On the next iteration there are a total of five $X_4$ nodes each having a single input edge and two output edges labeled $x'_4$ and $x_4$, respectively. The left-most two $X_4$ nodes each have single input edges from an $X_2$ node. Two other $X_4$ nodes have input edges from a single $X_3$ node and a last $X_4$ node has a single input from another $X_2$ node. Working across the $X_4$ level from left to right, each node is substituted by an OR gate. By inspection, each $X_4$ node has only a single input. Thus, at this level, all the $X_4$ nodes substituted OR gates are each single input gates which can be effectively deleted and are not shown in FIG. 7. Each output edge of each $X_3$ node is substituted by a dual-input AND gate with their associated edges connected accordingly as shown.

At the $X_5$ node level, there are a total of three $X_5$ nodes. The left-most $X_5$ node has two input edges; one input edge from each of the $X_4$ level nodes, namely $x_4$ and $x'_4$, respectively. Thus, an OR-gate will result from a connection of these two input edges. Note also that the right two $X_5$ level nodes also each have dual inputs from the previous $X_4$ level nodes. Thus, an OR-gate will also result in the substitution step with these nodes as well. For each output edge, a single AND gate is associated accordingly. Thus a total of three OR-gates and six AND gates are initially present.

There is only one $X_6$ level node. This node has two input edges. One input edge is from the $X_4$ level and the other input edge is from the $X_5$ level. Thus, an OR-gate will remain associated therewith in the circuit of FIG. 8. The output edges of the $X_6$ level node are each in turn substituted with an AND gate. Those gates associated with the zero end-terminal 510 have been deleted in the derived circuit of FIG. 8 for reasons previously discussed. Thus, only those edges associated with the one end-terminal 500 are illustrated. The result of this substitution step is shown in FIG. 8.

Lastly, an OR gate is substituted for the one end-terminal and all edges leading into the one end-terminal 500 are logically OR'ed together, as shown. The resulting circuit, with all the gates associated with the zero end-terminal 510 are deleted, is shown in FIG. 7.

The ENABLE is connected in accordance with the preferred embodiment. The ENABLE is toggled to perform a reset. This discharges the nodes in the circuit; effectively performing a reset. With the reset of the ENABLE=0, there are no gates at a state other than 0 in the derived circuit. The input states are then changed. After stabilization (charging), the ENABLE is set to a 1 state. The ENABLE=1 causes only those gates along a selected path from the root to the end-terminal output to assume a 1 state. The rest of the gates in the derived circuit are at a 0 state. Thus, with each input test vector, only a reduced number of gates along a pathway from input to output change value from a 0 state to 1 state. As such, the presently derived circuit in conjunction with the ENABLE toggle guarantees that only those gates along a single pathway from input to output change values. Therefore, only those switching nodes are in a power consumption mode. The number of transitions is bounded, and depending on the desired input states, only a reduced number of activated gates along a selected pathway are in a power consumption mode. The present invention thus achieves a reduced number of transitions on switching nodes within the circuit. Furthermore, the present method allows for deleting the AND and OR gates which correspond to the edges which are incident upon the zero end-terminal. In such a manner, the derived circuit reduces the number of gates which do not propagate to the output thereby contributing to the reduction of total power consumption.

A quantitative analysis of the total power consumed in the present circuit should be given. An AND gate in the present circuit is 1 if and only if the corresponding edge in the graph is traversed on evaluation. Since only one edge in the graph may be traversed per input variable, it follows that only one AND gate per input variable per output is set to a 1 state. Further, since each OR gate feeds two AND gates and since the OR gate rising must force one of the two successor AND gates to rise, it also follows then that at most one OR gate rises for each rising AND gate. The OR gate denoting a node in the starting graph may have fan-in equal to the in-degree of the node which can be, in some instance, high. This is the case particularly near the one end-terminal of the graph.

POWER CONSIDERATIONS

A two-input gate realization is utilized herein for estimating power consumption of a circuit. The power consumed by a transition on a particular gate output is directly proportional to the fan-out of that gate, for example, the power consumed by a transition on a gate with a fan-out of number n and the power consumed per gate is P is n*P power. With regard to a Shannon graph, if M denotes the largest fan-in of a node in the Shannon graph, an OR-gate with M inputs, for example can be decomposed into a balanced binary tree of two input OR-gates thereby yielding an OR-Tree of depth at most $\log_2 M$. Then for a Shannon graph with n inputs and m output circuits, at most nm AND-gates and $nm(\log_2 M)$ OR-gates can become active when enabled. In the circuit derived from the Shannon graph in the related application and used herein, the circuit is enabled when an ENABLE signal is set to 1. When reset, ENABLE=0, these same gates fall, i.e., return to a 0 state, thus on a full ENABLE cycle, at most $2 \, nm(1+\log_2(M))$ gate transitions will occur.

This bound can be improved by employing a non-reduced Shannon graph as the starting graph wherein each internal node in the graph has an in-degree value of at most 2. This is achieved by duplicating nodes in the graph while traversing the graph from the root towards the end-terminal points in accordance with the preferred embodiment of the present invention. In this case, there may be up to $2^n$ edges leading into the one end-terminal for each output. Using a balanced tree decomposition into two input OR gates at the gate for the one end-terminal yields an upper bound of at most 4 nm transitions. In some instances, this bound may actually be higher than the previously discussed upper bound.

This accounts for the power dissipated due to switching of nodes internal to the derived circuit. However, the power expended when the primary inputs change must also be taken into account. Separate techniques to reduce power consumption at the primary inputs are disclosed in U.S. patent application Ser. No. 08/427,052 entitled "Conditional Selection Method For Reducing Power Consumption In A Circuit", filed Apr. 24, 1995, by Alexander Saldanha, Patrick McGeer, and Luciano Lavagno, and to U.S. patent application Ser. No. 08/427,051 entitled "Dominator Selection Method For Reducing Power Consumption In A Circuit", filed Apr. 24, 1995, by Alexander Saldanha and Patrick McGeer, now U.S. Pat. No. 5,649,166, and both commonly owned and assigned. Attention is respectfully directed thereto.

There are other advantages that the circuit of the present invention provides over prior art techniques for synthesis of low-power logic circuits. In the arts, the estimation of the number of transitions used to estimate the power consumption can be difficult because, in a general circuit, i.e., non-Shannon circuit, the transition activity is dependent on both the logic and the function of the circuit elements. In other words, under different delays for the various circuit elements, there may be a different numbers of transitions within the circuit for the same input vector. This effect is caused by the arrival of multiple signal transitions at different times at the inputs of the circuit elements and causes two related problems. The first related problem is that the average power is difficult to estimate accurately. The second problem is that the power is dependent on circuit delays. The circuit of the present invention resolves both problems because the power consumption under each input vector can be determined and, since there is exactly one transition per input per output, as discussed, there is no dependence on the delays of the internal nodes in the circuit because the derived circuit of the present invention is delay independent.

Lastly, it should be pointed out that it is envisioned herein that the disclosed and claimed techniques of the present invention will find their end uses in all levels of circuit design, development, and implementation including computer software implementations used to test, evaluate, and generate low-power circuits in accordance with the present techniques.

It will be appreciated by those skilled in this particular art that the present invention can be embodied in other specific forms without departing from the spirit or essential characteristics thereof. The scope of the invention is therefore indicated by the appended claims rather than the foregoing description and all changes that come within the meaning and range of equivalents thereof are intended to be considered as being embraced within their scope.

What is desired to be secured by United States Letters Patents is:

1. A method for generating a low-power circuit from a Shannon graph having a plurality of primary inputs, a plurality of nodes including parent and child nodes, a first end-terminal, and a second end-terminal, each of the plurality of nodes having output edges associated therewith, the method comprising the steps of:

substituting the plurality of nodes and associated output edges with a plurality of cells, one cell for each node and output edge associated therewith, each cell including a plurality of elements;

coupling a cell substituted for a parent node to cells substituted for child nodes of the parent node; and bypassing particular elements of child nodes having only one parent node.

2. A method for generating a low-power circuit from a Shannon graph having a plurality of primary inputs, a plurality of nodes including parent and child nodes, a first end-terminal, and a second end-terminal, each of the plurality of nodes having output edges associated therewith, the method comprising steps of:

substituting the plurality of nodes and associated output edges with a plurality of cells, one cell for each node and output edge associated therewith, each cell including a plurality of elements, wherein each cell comprises an OR gate and two AND gates, and wherein the substituting step comprises the steps of:

substituting each of the plurality of nodes with an OR gate;

substituting a first and a second output edge associated with each node with AND gates;

coupling an output of the OR gate to the first and the second AND gates; and coupling primary input leads associated with each node to the first and the second AND gates;

coupling a cell substituted for a parent node to cells substituted for child nodes of the parent node; and bypassing particular elements of child nodes having only one parent node.

3. The method of claim 2 wherein the coupling a cell step comprises the step of:

coupling the first and the second AND gates of a parent node to OR gates of child nodes of the parent node.

4. The method of claim 3 wherein the bypassing step comprises:

bypassing OR gates of child nodes having only one parent node.

5. The method of claim 4, further comprising the steps of:

substituting the first end-terminal with a first particular OR gate;

substituting the second end-terminal with a second particular OR gate;

coupling AND gates of parent nodes of the first end-terminal to the first particular OR gate;

coupling AND gates of parent nodes of the second end-terminal to the second particular OR gate.

6. The method of claim 5, further comprising the step of:

removing the second particular OR gate; and removing AND gates of parent nodes of the second end-terminal.

7. A method for generating a low-power circuit from a Shannon graph having a plurality of primary inputs, a plurality of nodes including parent and child nodes, a first end-terminal and a second end-terminal, each of the plurality of nodes having output edges associated therewith, the method comprising the steps of:

substituting the plurality of nodes and associated output edges with a plurality of cells, one cell for each node and output edge associated therewith, each cell including a plurality of elements;

coupling a cell substituted for a parent node to cells substituted for child nodes of the parent node;

bypassing particular elements of child nodes having only one parent node;

coupling an ENABLE signal to a parent node; and setting the ENABLE to a low state, thereby resetting the low-power circuit.

8. The method of claim 5 further comprising the step of:

setting input states for the plurality of primary inputs.

9. The method of claim 8 further comprising the step of:

setting the ENABLE signal to a high state, thereby enabling the low-power circuit.

10. A method of forming a low-power circuit from a Shannon graph having a plurality of nodes and end-terminals, the plurality of nodes including parent nodes and child nodes, each parent node having a plurality of output edges and a plurality of primary input leads, each of the plurality of output edges for each parent node coupled to a child node, the method comprising the steps of:

substituting the plurality of nodes with a plurality of OR gates, one OR gate for each node;

substituting the end terminals with OR gates, one OR gate for each terminal;

substituting the plurality of output edges for a particular parent node with a plurality of AND gates, one AND gate for each output edge;

coupling an output of an OR gate substituted for the particular parent node to first inputs of the plurality of AND gates for the particular parent node;

coupling the plurality of primary input leads for the particular parent node to second inputs of the plurality of AND gates for the particular parent node;

coupling outputs of the plurality of AND gates for the parent node to inputs of OR gates for each child node of the particular parent node;

coupling outputs the plurality of AND gates for the parent node to inputs of OR gates for each end terminal of the particular parent node; and bypassing OR gates having inputs coupled to less than two of the plurality of AND gates.

11. The method of claim 10, further comprising the step of:

removing a particular OR gate of one of the end terminals; and removing AND gates coupled to the particular OR gate.

12. A low-power circuit produced in accordance with the method of claim 5.

13. A low-power circuit produced in accordance with the method of claim 10.

14. A system for generating a low-power circuit from a Shannon graph having a plurality of primary inputs, a plurality of nodes including parent child nodes, a first end-terminal, and a second end-terminal, each of the plurality of nodes having output edges associated therewith, the system including a processor and a memory, the system further comprising:

an input device, coupled to the memory for inputting the Shannon graph into the memory;

means, coupled to the memory for substituting the plurality of nodes and associated output edges with a plurality of cells, one cell for each node and output edge associated therewith, each cell including a plurality of elements;

means, coupled to the memory for coupling a cell substituted for a parent node to cells substituted for child nodes of the parent node;

means, coupled to the memory for bypassing particular elements of child nodes having only one parent node; and an output device, coupled to the processor and to the memory for outputting the low-power circuit.

15. A system for generating a low-power circuit from a Shannon graph having a plurality of nodes and end-terminals, the plurality of nodes including parent nodes and child nodes, each parent node having a plurality of output edges and a plurality of primary input leads, each of the plurality of output edges for each parent node coupled to a child node, the system including a processor and memory, the system further comprising:

an input device, coupled to the memory, for inputting the Shannon graph into the memory;

means, coupled to the memory for substituting the plurality of nodes with a plurality of OR gates, one OR gate for each node;

means, coupled to the memory for substituting the end terminals with OR gates, one OR gate for each terminal;

means, coupled to the memory for substituting the plurality of output edges for a particular parent node with a plurality of AND gates, one AND gate for each output edge;

means, coupled to the memory for coupling an output of an OR gate substituted for the particular parent node to first inputs of the plurality of AND gates for the particular parent node;

means, coupled to the memory for coupling the plurality of primary input leads for the particular parent node to second inputs of the plurality of AND gates for the particular parent node;

means, coupled to the memory for coupling outputs of the plurality of AND gates for the parent node to inputs of OR gates for each child node of the particular parent node;

means, coupled to the memory for coupling outputs the plurality of AND gates for the parent node to inputs of OR gates for each end terminal of the particular parent node;

means, coupled to the memory for bypassing OR gates having inputs coupled to less than two of the plurality of AND gates;

an output device, coupled to the processor and to the memory for outputting the low-power circuit.

16. A system for generating a low-power circuit from a Shannon graph having a plurality of primary inputs, a plurality of nodes including parent and child nodes, a first end-terminal, and a second end-terminal, each of the plurality of nodes having output edges associated therewith, the system comprising:

a memory;

an input device, coupled to the memory for inputting the Shannon graph into the memory;

a processor, coupled to the memory for substituting the plurality of nodes and associated output edges with a plurality of cells, one cell for each node and output edge associated therewith, each cell including a plurality of elements, for coupling a cell substituted for a parent node to cells substituted for child nodes of the parent node, and for bypassing particular elements of child nodes having only one parent node; and an output device, coupled to the processor and to the memory for outputting the low-power circuit.

17. The system of claim 16 wherein each cell comprises an OR gate and two AND gates, and wherein the processor substitutes each of the plurality of nodes with an OR gate, substitutes a first and a second output edge associated with each node with AND gates, couples an output of the OR gate to the first and the second AND gates, and couples primary input leads associated with each node to the first and the second AND gates.

18. A computer program product, for a computer system including a processor and a memory, for generating a low-power circuit from a Shannon graph having a plurality of primary inputs, a plurality of nodes including parent and child nodes, a first end-terminal, and a second end-terminal, each of the plurality of nodes having output edges associated therewith, the computer program product comprising:

a computer readable storage medium comprising:

code that directs the processor to substitute the plurality of nodes and associated output edges with a plurality of cells, one cell for each node and output edge associated therewith, each cell including a plurality of elements;

code that directs the processor to couple a cell substituted for a parent node to cells substituted for child nodes of the parent node; and code that directs the processor to bypass particular elements of child nodes having only one parent node.

19. The computer program product of claim 18 wherein each cell comprises an OR gate and two AND gates, and wherein the code that directs the processor to substitute the plurality of nodes comprises:

code that directs the processor to substitute each of the plurality of nodes with an OR gate;

code that directs the processor to substitute a first and a second output edge associated with each node with AND gates;

code that directs the processor to couple an output of the OR gate to the first and the second AND gates; and code that directs the processor to couple primary input leads associated with each node to the first and the second AND gates.

* * * * *